(12) United States Patent
Houle et al.

(10) Patent No.: US 7,014,093 B2
(45) Date of Patent: Mar. 21, 2006

(54) MULTI-LAYER POLYMER-SOLDER HYBRID THERMAL INTERFACE MATERIAL FOR INTEGRATED HEAT SPREADER AND METHOD OF MAKING SAME

(75) Inventors: Sabina J. Houle, Phoenix, AZ (US); Ashay A. Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 10/607,738

(22) Filed: Jun. 26, 2003

(65) Prior Publication Data

US 2004/0262372 A1 Dec. 30, 2004

(51) Int. Cl.
*B23K 31/02* (2006.01)

(52) U.S. Cl. .................. 228/56.3; 428/295.1
(58) Field of Classification Search .............. 228/56.3; 428/295.1, 297.4; 257/778
See application file for complete search history.

(56) References Cited

U.S. PATENT DOCUMENTS

| | | | |
|---|---|---|---|
| 4,782,893 A | 11/1988 | Thomas | |
| 5,098,320 A | 3/1992 | Colleran et al. | |
| 5,820,014 A | 10/1998 | Dozier, II et al. | |
| 5,931,222 A | 8/1999 | Toy et al. | |
| 5,981,085 A | 11/1999 | Ninomiya et al. | |
| 6,008,988 A | 12/1999 | Palmer | |
| 6,197,859 B1 | 3/2001 | Green et al. | |
| 6,219,243 B1 | 4/2001 | Ma et al. | |
| 6,292,367 B1 * | 9/2001 | Sikka et al. ................ | 361/705 |
| 6,343,647 B1 | 2/2002 | Kim et al. | |
| 6,462,410 B1 | 10/2002 | Novotny et al. | |
| 6,602,777 B1 | 8/2003 | Kao et al. | |
| 6,751,099 B1 | 6/2004 | Vrtis et al. | |
| 6,784,540 B1 * | 8/2004 | Cardwell ................... | 257/722 |
| 6,867,978 B1 * | 3/2005 | Whittenburg et al. ....... | 361/719 |
| 2002/0135984 A1 | 9/2002 | Greenwood et al. | |
| 2003/0150604 A1 * | 8/2003 | Koning et al. .............. | 165/185 |
| 2003/0178720 A1 * | 9/2003 | Rumer et al. ............... | 257/715 |
| 2003/0178730 A1 * | 9/2003 | Rumer et al. ............... | 257/778 |
| 2004/0066630 A1 * | 4/2004 | Whittenburg et al. ....... | 361/719 |
| 2004/0118501 A1 * | 6/2004 | Chiu et al. .................... | 156/64 |
| 2004/0180202 A1 * | 9/2004 | Lawton et al. .............. | 428/375 |
| 2004/0261980 A1 | 12/2004 | Dani et al. | |
| 2004/0262372 A1 * | 12/2004 | Houle et al. ................ | 228/246 |
| 2005/0027055 A1 * | 2/2005 | Dani et al. .................. | 524/439 |
| 2005/0045855 A1 * | 3/2005 | Tonapi et al. ............... | 252/500 |
| 2005/0056365 A1 * | 3/2005 | Chan ....................... | 156/307.7 |

FOREIGN PATENT DOCUMENTS

| | | |
|---|---|---|
| WO | WO-02091395 A1 | 11/2002 |
| WO | WO-05006361 A2 | 1/2005 |

OTHER PUBLICATIONS

Chang, Chin-An , "Enhanced Cu-Teflon adhesion by pre-sputtering treatment: Effect of surface morphology changes", *Applied Physics Letters, 51(16)*, (Oct. 19, 1987), 1236-1238.

(Continued)

*Primary Examiner*—Jonathan Johnson
(74) *Attorney, Agent, or Firm*—Schwegman, Lundberg, Woessner & Kluth, P.A.

(57) ABSTRACT

A process of making a multi-layer thermal interface material is depicted. The multi-layer thermal interface material is attached between an integrated heat spreader and a die. Processing of the multi-layer thermal interface material includes stamping or other pressure processing.

24 Claims, 8 Drawing Sheets

OTHER PUBLICATIONS

Perrins, L E., et al., "Mechanism for the adhesion of electroplated copper to polypropylene", *Plastics and Polymers, 39(144)*, (Dec. 1971),391-397.

International Search Report issued in connection with International App. No. PCT/US2004/018164 on May 25, 2005 (7 pgs.).

* cited by examiner

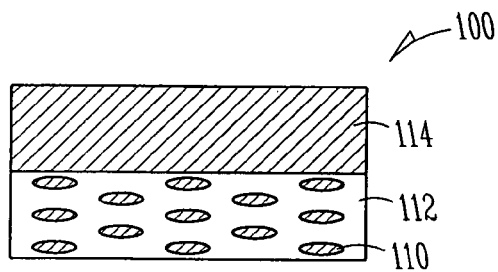
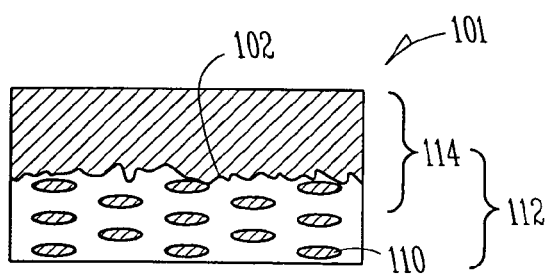
*Fig. 1A*  *Fig. 1B*
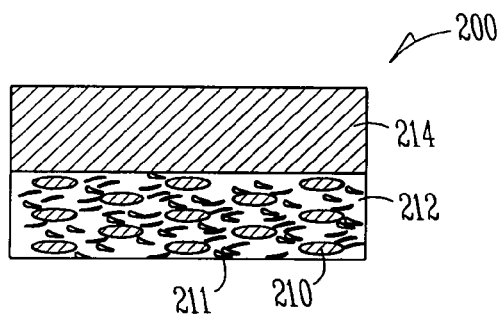
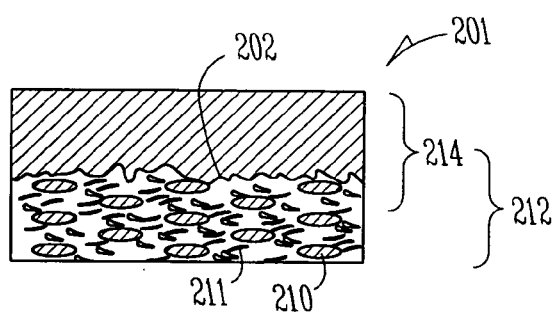
*Fig. 2A*  *Fig. 2B*
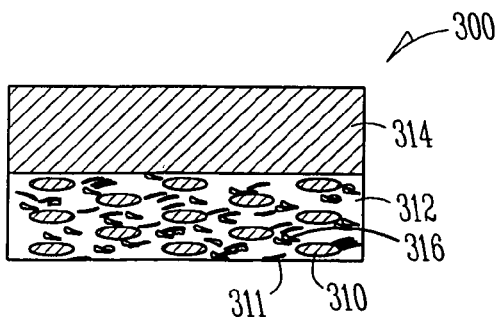
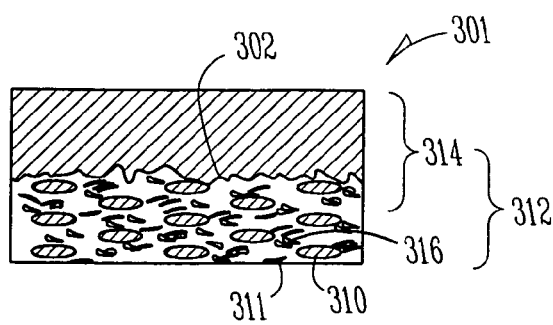
*Fig. 3A*  *Fig. 3B*

MULTI-LAYER POLYMER-SOLDER HYBRID THERMAL INTERFACE MATERIAL FOR INTEGRATED HEAT SPREADER AND METHOD OF MAKING SAME

TECHNICAL FIELD

Disclosed embodiments relate to a multi-layer thermal interface material for an integrated heat spreader.

BACKGROUND INFORMATION

An integrated circuit (IC) die is often fabricated into a processor, a digital signal processor (DSP), and other devices for various tasks. The increasing power consumption of such dice results in tighter thermal budgets for a thermal solution design when the die is employed in the field. Accordingly, a thermal interface is often needed to allow the die to reject heat more efficiently.

The most common thermal interface can employ a heat sink such as a heat spreader that is coupled to the backside of a die. One of the issues encountered when using an integrated heat spreader (IHS) is getting a balance between sufficient adhesion to the die, and a high enough heat flow to meet the cooling requirements of the die. To deal with this issue, several bonding materials have been tried with varying results. If the adhesion is insufficient, the IHS may spall off from the thermal interface material (TIM) and result in a yield issue or a field failure. One technicality encountered is achieving an acceptable IHS standoff from the die and the board to which the board is mounted.

BRIEF DESCRIPTION OF THE DRAWINGS

In order to understand the manner in which embodiments are obtained, a more particular description of various embodiments of the invention briefly described above will be rendered by reference to the appended drawings. These drawings depict embodiments that are not drawn to scale and are not to be considered to be limiting of its scope. Some embodiments will be described and explained with additional specificity and detail through the use of the accompanying drawings in which:

FIG. 1A is a side cross-section of a heat transfer subsystem according to an embodiment;

FIG. 1B depicts the heat transfer composite in FIG. 1A after further processing;

FIG. 2A is a side cross-section of a heat transfer subsystem according to an embodiment;

FIG. 2B depicts the heat transfer composite in FIG. 2A after further processing;

FIG. 3A is a side cross-section of a heat transfer subsystem according to an embodiment;

FIG. 3B depicts the heat transfer composite in FIG. 3A after further processing;

DETAILED DESCRIPTION

Figure 4:
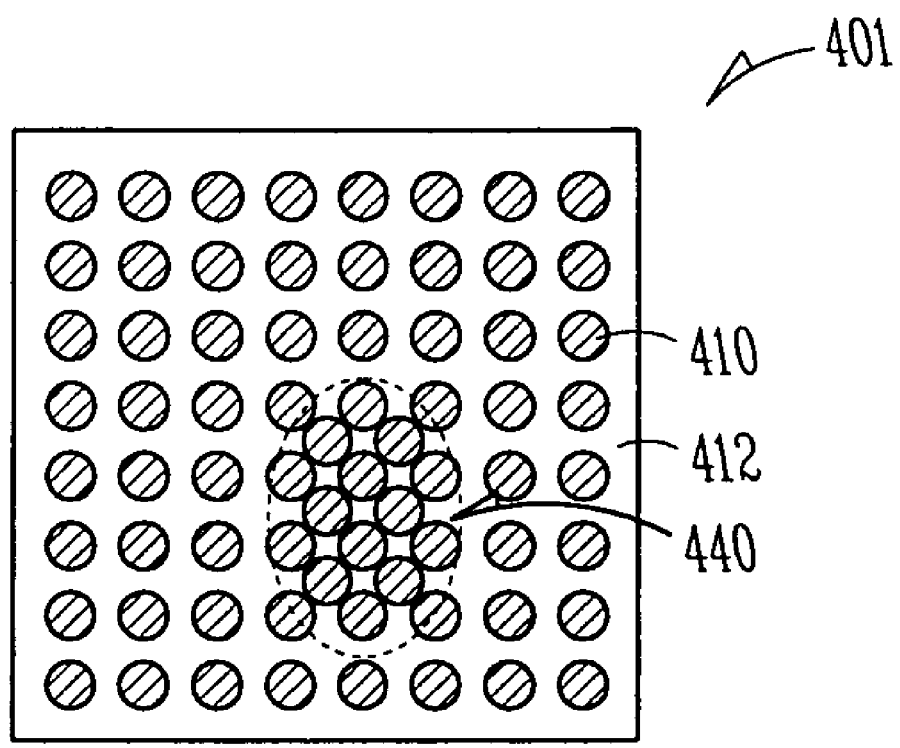
FIG. 4 is a bottom cross-section of a heat transfer composite according to an embodiment.

One embodiment relates to a multi-layer polymer-solder hybrid (PSH) heat transfer structure. One embodiment relates to a system that includes a thermal interface material (TIM) intermediary that includes a multi-layer PSH heat transfer structure. One embodiment relates to a process of making a multi-layer PSH heat transfer composite. In an embodiment, the multi-layer PSH heat transfer structure is disposed between a heat spreader and a die. One embodiment includes a method of bonding a die to a heat spreader through a multi-layer PSH heat transfer composite that uses a die-referenced process as opposed to a substrate-referenced process.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic work piece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structures of embodiments most clearly, the drawings included herein are diagrammatic representations of inventive articles. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1A is a side cross-section of a heat transfer subsystem 100 according to an embodiment. The heat transfer subsystem 100 is applicable to various chip packaging systems according to embodiments set forth herein and their art-recognized equivalents.

According to various embodiments, the heat transfer subsystem 100 is a combination of a plurality of first heat transfer structures 110 and a second heat transfer structure 112 that acts as a matrix for the plurality of first heat transfer structures 110. The plurality of first heat transfer structures 110 and the second heat transfer structure 112 are also referred to as a heat transfer preform. A solder preform 114 completes the heat transfer subsystem 100. In an embodiment, the heat transfer subsystem 100 includes a polymer matrix for the second heat transfer structure 112, and a metal or alloy for the plurality of first heat transfer structures 110. The matrix of the second heat transfer structure 112 is to be adhered to a material such as the backside surface of a die.

The plurality of first heat transfer structures 110 are used to increase the average heat transfer coefficient through the matrix of the second heat transfer structure 112. In another embodiment that relates to the thermal interface, either alone or applied in a chip package, the plurality of first heat transfer structures 110 is present in relation to the second heat transfer structure 112 in a volume range from about 0.1% to about 5%. In another embodiment, the plurality of first heat transfer structures 110 is present in relation to the second heat transfer structure 112 in a volume range from about 0% to about 0.1%. In another embodiment, the plurality of first heat transfer structures 110 is present in relation to the second heat transfer structure 112 in a volume range from about 0% to about 100%. In another embodiment, the plurality of first heat transfer structures 110 is present in relation to the second heat transfer structure 112 in a volume range from about 2% to about 10%.

In an embodiment, the plurality of first heat transfer structures 110 have a coefficient of thermal conductivity in a range from about 90 Watt per meter degree Kelvin (W/m-K) to about 700 W/m-K. The plurality of first heat transfer structures 110 are depicted as uniformly dispersed in the matrix of the second heat transfer structure 112. The plurality of first heat transfer structures 110 are depicted as arranged in a pattern, but this pattern is only one embodiment, as other arrangements can be implemented, including random dispersion. Further, the plurality of first heat transfer structures 110 is not necessarily drawn to scale. In an embodiment, the heat transfer subsystem 100 depicted in FIG. 1A is a section taken from a larger article. In an embodiment, the diameter (or the characteristic dimension) of a given first heat transfer structure 110 is in a range from about 1 micron to about 1,000 micron.

In an embodiment, the heat transfer subsystem 100 has a thickness in a range from about 0.1 mil to about 100 mil. Although the plurality of first heat transfer structures 110 is depicted as spaced apart in the matrix that is the second heat transfer structure 112, in an embodiment, the plurality of first heat transfer structures 110 can be touching each other in a close-packed configuration, and the second heat transfer structure 112 acts as an interstitial matrix.

In an embodiment, the second heat transfer structure 112 that forms the matrix for the plurality of first heat transfer structures 110 is a metal alloy with a coefficient of thermal conductivity in a range from about 30 W/m-K to about 90 W/m-K. A metal alloy second heat transfer structure 112 is useful for bonding to a plated die such as a gold-plated die. In an embodiment, the second heat transfer structure 112 is a polymer, and the first heat transfer structure 110 is a metal or a metal alloy. In an embodiment, the first heat transfer structure 110 is indium (In) and the second heat transfer structure 112 is a polymer. In an embodiment, the first heat transfer structure 110 is an indium-tin (InSn) alloy, and the second heat transfer structure 112 is a polymer. In an embodiment, the first heat transfer structure 110 is tin, and the second heat transfer structure 112 is a polymer. In an embodiment, the first heat transfer structure 110 is an indium-silver (InAg) alloy, and the second heat transfer structure 112 is a polymer. In an embodiment, the first heat transfer structure 110 is a tin-silver (SnAg) alloy, and the second heat transfer structure 112 is a polymer. In an embodiment, the first heat transfer structure 110 is a tin-silver-copper (SnAgCu) alloy, and the second heat transfer structure 112 is a polymer.

In an embodiment, the second heat transfer structure 112 is a metal or metal alloy, and the first heat transfer structure 110 is a particulate such as graphite fiber, or diamond powder. In an embodiment, the first heat transfer structure 110 is indium, and the second heat transfer structure 112 is a particulate such as graphite fiber, or diamond powder. In an embodiment, the first heat transfer structure 110 is an indium-tin alloy, and the second heat transfer structure 112 is a particulate such as graphite fiber, or diamond powder. In an embodiment, the first heat transfer structure 110 is tin, and the second heat transfer structure 112 is a particulate such as graphite fiber, or diamond powder. In an embodiment, the first heat transfer structure 110 is an indium-silver alloy, and the second heat transfer structure 112 is a particulate such as graphite fiber, or diamond powder. In an embodiment, the first heat transfer structure 110 is a tin-silver alloy, and the second heat transfer structure 112 is a particulate such as graphite fiber, or diamond powder. In an embodiment, the first heat transfer structure 110 is a tin-silver-copper alloy, and the second heat transfer structure 112 is a particulate such as graphite fiber, or diamond powder.

In an embodiment, the solder preform 114 is a metal or metal alloy that adheres to an IHS or a metal-clad IHS. In an embodiment, the solder preform is an indium material. In an embodiment, the solder preform is an indium-tin material. In an embodiment, the solder preform is a tin material. In an embodiment, the solder preform is an indium-silver material. In an embodiment, the solder preform is a tin-silver material. In an embodiment, the solder preform is a tin-silver-indium material.

In an embodiment, the plurality of first heat transfer structures 110 includes high-thermal conductivity fibers such as metal filaments. In an embodiment, the plurality of first heat transfer structures 110 represents high-thermal conductivity fibers such as glass fibers. In an embodiment, the plurality of first heat transfer structures 110 represents high-thermal conductivity fibers that include graphite fibers. In an embodiment, the plurality of first heat transfer structures 110 represents high-thermal conductivity fibers that include graphite fibers and metal filaments. In an embodiment, the plurality of first heat transfer structures 110 represents high-thermal conductivity fibers that include graphite fibers and glass fibers. In an embodiment, the plurality of first heat transfer structures 110 represents high-thermal conductivity fibers that include metal filaments and glass fibers. In an embodiment, all three of metal, glass, and graphite fibers are included. Various article qualities can be achieved by selecting at least one of a graphite, metal, and glass fiber and fixing at least one of them in a second heat transfer structure 112 such as the matrix depicted in FIG. 1A.

In an embodiment, the matrix of the second heat transfer structure 112 is an organic matrix such as a polymer that has a high adhesion to bare die such as bare monocrystalline silicon.

The plurality of first heat transfer structures 110 and the second heat transfer structure 112 form a first heat transfer composite shape that in an embodiment is a polymer-solder hybrid (PSH). In an embodiment, the first heat transfer composite shape is severed from a supply stock that has been either continuously, semi-continuously, or batch processed as set forth herein. When the first heat transfer composite shape is therefore viewed as depicted in FIG. 1A, and after a portion has been severed, it is coupled with a solder preform 114 that is the heat transfer subsystem 100.

FIG. 1B is a depiction of the heat transfer subsystem 100 in FIG. 1A as a heat transfer composite 101 after processing. An interface 102 has been accomplished that acts to blend the matrix of the second heat transfer structure 112 and the solder preform 114. The interface 102 is represented as an arbitrary shape and expanse. In an embodiment, the matrix of the second heat transfer structure 112 and the solder preform 114 are substantially blended, such that a solder-rich zone 114 overlaps into a polymer-rich zone 112. In an embodiment, the respective zones are further blended until a solder-rich gradient 114 is detectable with a diminishing solder concentration, as it blends into a polymer-rich gradient 112 with an increasing polymer concentration.

Processing to achieve the interface 102 for the heat transfer composite 161 can be done by various operations. In an embodiment, the solder preform 114 and the second heat transfer structure 112 are pressed under a heat load. In an embodiment, the solder preform 114 and the second heat transfer structure 112 are cold stamped.

FIG. 2A is a side cross-section of a heat transfer subsystem 200 according to an embodiment. The heat transfer subsystem 200 is applicable to various chip packaging systems according to embodiments set forth herein and their art-recognized equivalents.

According to the various embodiments set forth in this disclosure for a heat transfer subsystem, the heat transfer subsystem 200 is a combination of a plurality of first heat transfer structures 210 and a second heat transfer structure 212. Additionally, a plurality of first particulates 211 is interspersed within the second heat transfer structure 212.

In an embodiment, the second heat transfer structure 212 that forms the matrix for the plurality of first heat transfer structures 210 is a metal alloy according to various embodiment set forth herein.

In an embodiment, the second heat transfer structure 212 is an organic composition according to various embodiment set forth herein. In an embodiment, the second heat transfer structure 212 that forms the matrix for the plurality of first heat transfer structures 210 is a metal alloy according to various embodiment set forth herein. In an embodiment, the second heat transfer structure 212 is an organic composition according to various embodiment set forth herein. In an embodiment, the second heat transfer structure 212 that forms the matrix for the plurality of first heat transfer structures 210 is a metal alloy with a coefficient of thermal conductivity in a range from about 30 W/m-K to about 90 W/m-K. In an embodiment, the second heat transfer structure 212 is an organic composition such as a high thermal conductivity polymer with a coefficient of thermal conductivity in a range from about 0.1 W/m-K to about 1 W/m-K.

In an embodiment, the plurality of first particulates 211 includes inorganics that are metallic in an organic matrix of the second heat transfer structure 212. In this embodiment, the overall coefficient of thermal conductivity for the heat transfer subsystem 200 is in a range from about 0.1 W/m-K to less than or equal to about 600 W/m-K.

In an embodiment, the plurality of first particulates 211 includes inorganics that are metallic in a metallic matrix of the second heat transfer structure 212. In this embodiment, the overall coefficient of thermal conductivity for the heat transfer subsystem 200 is in a range from about 20 W/m-K to less than or equal to about 600 W/m-K.

In an embodiment, the plurality of first particulates 211 includes inorganics that are dielectrics in an organic matrix of the second heat transfer structure 212. In this embodiment, the overall coefficient of thermal conductivity for the heat transfer subsystem 200 is in a range from about 10 W/m-K to about 90 W/m-K.

In an embodiment, the plurality of first particulates 211 includes inorganics that are dielectrics in a metallic matrix of the second heat transfer structure 212. In this embodiment, the overall coefficient of thermal conductivity for the heat transfer subsystem 200 is in a range from about 20 W/m-K to less than or equal to about 600 W/m-K.

Although the plurality of first particulates 211 is depicted as angular and eccentric shapes, in an embodiment, the plurality of first particulates 211 can be other shapes. In an embodiment, the plurality of first particulates 211 is a substantially spherical powder that has an average diameter in a range from about 0.1 micron to about 10 micron. In an embodiment, the eccentricity of the particulates 211, as measured by a ratio of the major diagonal axis to the minor diagonal axis, is in a range from about 1 to about 10. In an embodiment, the eccentricity is greater than 10.

The combination of the plurality of first heat transfer structures 210, the second heat transfer structure 212, and the plurality of first particulates 211 presents a conglomerate channel from one surface of the second heat transfer structure 212 to an opposite surface thereof As such, heat transfer through the matrix is expedited.

FIG. 2B is a depiction of the heat transfer subsystem 200 in FIG. 2A as a heat transfer composite 201 after processing. An interface 202 has been accomplished that blends the matrix of the second heat transfer structure 212 and the solder preform 214. The interface 202 is represented as an arbitrary shape and expanse. In an embodiment, the matrix of the second heat transfer structure 212 and the solder preform 214 are substantially blended, such that a solder-rich zone 214 overlaps into a polymer-rich zone 212. In an embodiment, the respective zones are further blended until a solder-rich gradient 214 is detectable with a diminishing solder concentration, as it blends into a polymer-rich gradient 212 with an increasing polymer concentration.

Processing to achieve the interface 202 for the heat transfer composite 201 can be done by various operations. In an embodiment, the solder preform 214 and the second heat transfer structure 212 are pressed under a heat load. In an embodiment, the solder preform 214 and the second heat transfer structure 212 are cold stamped.

FIG. 3A is a side cross-section of a heat transfer subsystem 300 according to an embodiment. The heat transfer subsystem 300 that is depicted is applicable to various chip packaging systems according to embodiments set forth herein and their art-recognized equivalents.

According to the various embodiments set forth in this disclosure for the heat transfer subsystems, the heat transfer subsystem 300 is a combination of a plurality of first heat transfer structures 310 and a second heat transfer structure 312 that acts as a matrix for the plurality of first heat transfer structures 310. A plurality of first particulates 311 is interspersed within the second heat transfer structure 312. Additionally, a plurality of second particulates 316 is also interspersed within the second heat transfer structure 312. Similar to the plurality of first particulates 311, the plurality of second particulates 316 has an eccentricity ratio. The two eccentricity ratios can be related or they can be independent of each other.

In an embodiment, the second heat transfer structure 312 that forms the matrix for the plurality of first heat transfer structures 310 is a metal alloy according to various embodiments set forth herein. In an embodiment, the second heat transfer structure 312 is an organic composition according to various embodiments set forth herein.

In an embodiment, the plurality of first particulates 311 is a first metal, and the plurality of second particulates 316 is a second metal. In this embodiment, the overall coefficient of thermal conductivity for the heat transfer subsystem 300 is in a range from about 20 W/m-K to less than or equal to about 600 W/m-K.

In an embodiment, the plurality of first particulates 311 is a first dielectric, and the plurality of second particulates 316 is a second dielectric. In this embodiment, the overall coefficient of thermal conductivity for the heat transfer subsystem 300 is in a range from about 5 W/m-K to less than or equal to about 600 W/m-K.

In an embodiment, the plurality of first particulates 311 is a dielectric, and the plurality of second particulates 316 is a metal. In this embodiment, the overall coefficient of thermal conductivity for the heat transfer subsystem 300 is in a range from about 20 W/m-K to less than or equal to about 600 W/m-K.

In an embodiment, the plurality of first particulates 311 is a metal, and the plurality of second particulates 316 is a dielectric. In this embodiment, the overall coefficient of thermal conductivity for the heat transfer subsystem 300 is in a range from about 20 W/m-K to less than or equal to about 600 W/m-K.

Although the shapes for the plurality of first particulates 311 and the plurality of second particulates 316 are respectively depicted as eccentric and round, these shapes are depicted to distinguish the two particulate types.

The combination of the plurality of first heat transfer structures 310, the second heat transfer structure 312, the plurality of first particulates 311, and the plurality of second particulates 316 presents a conglomerate channel from one surface of the second heat transfer structure 312 to an opposite surface thereof. As such, heat transfer through the matrix is expedited.

FIG. 3B is a depiction of the heat transfer subsystem 300 in FIG. 3A as a heat transfer composite 301 after processing. An interface 302 has been accomplished that blends the matrix of the second heat transfer structure 312 and the solder preform 314. The interface 302 is represented as an arbitrary shape and expanse. In an embodiment, the matrix of the second heat transfer structure 312 and the solder preform 314 are substantially blended, such that a solder-rich zone 314 overlaps into a polymer-rich zone 312. In an embodiment, the respective zones are further blended until a solder-rich gradient 314 is detectable with a diminishing solder concentration, as it blends into a polymer-rich gradient 312 with an increasing concentration.

Processing to achieve the interface 302 for the heat transfer composite 301 can be done by various operations. In an embodiment, the solder preform 314 and the second heat transfer structure 312 are pressed under a heat load. In an embodiment, the solder preform 314 and the second heat transfer structure 312 are cold stamped.

FIG. 4 is a cross-section of a heat transfer composite 401 according to an embodiment. The cross-section reveals a plurality of first heat transfer structures 410 and a second heat transfer structure 412 that acts as a matrix for the plurality of first heat transfer structures 410 according to various embodiments set forth herein.

FIG. 4 depicts a cross-section of the heat transfer composite 401, which in this embodiment includes a pattern of the plurality of first heat transfer structures 410 and that are discretely disposed within the second heat transfer structure 412. Further depicted in FIG. 4 is a concentration region 440 of the heat transfer subsystem 400. In the concentration region 440, a higher density occurs for the plurality of first heat transfer structures 410. In an embodiment, the concentration region 440 is configured to be located proximate an excessively hot region of a die to facilitate heat removal. For example, a level zero cache ("L0 cache") can be located on a die that has a high frequency of access and accompanying heat generation. By concentrating more of the plurality of heat transfer structures 410 in a concentration region 440 that will be aligned with the die at a more active region, a more efficient heat transfer conduit is provided, but adhesion of the heat transfer subsystem 400 to a die and heat sink is not compromised, due to a sufficient amount of the second heat transfer structure 412 that is adhering to the die. This larger heat transfer capability in the concentration region 440 represents a lowered resistance to heat flow between the heat-generating die and the heat-removing heat spreader.

Figure 5A:
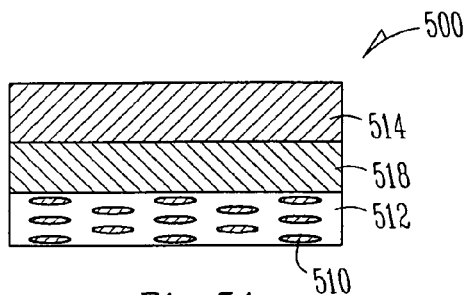
FIG. 5A is a side cross-section of a heat transfer subsystem according to an embodiment.

FIG. 5A is a side cross-section of a heat transfer subsystem 500 according to an embodiment. The heat transfer subsystem 500 is applicable to various chip packaging systems according to embodiments set forth herein and their art-recognized equivalents.

According to the various embodiments set forth in this disclosure, the heat transfer subsystem 500 includes a combination of a plurality of first heat transfer structures 510 and a second heat transfer structure 512 that acts as a matrix for the plurality of first heat transfer structures 510. The second heat transfer structure 512 is added to a solder preform 514 and a middle heat transfer structure 518. The middle heat transfer structure 518 includes a combination of materials that approaches a discrete approximation between the material of the solder preform 514, and the blended materials of the first heat transfer structure 510 and the matrix of the second heat transfer structure 512.

Figure 5B:
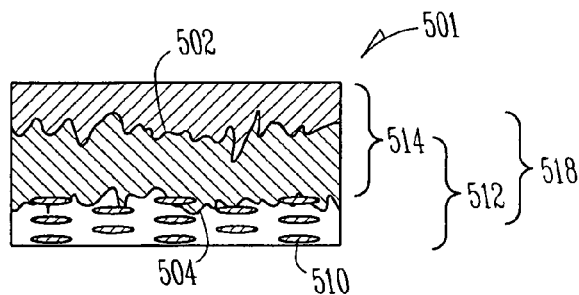
FIG. 5B depicts the heat transfer composite in FIG. 5A after further processing.

FIG. 5B is a depiction of the heat transfer subsystem 500 in FIG. 5A as a heat transfer composite 501 after processing. A first interface 502 has been accomplished that blends the solder preform 514 with the middle heat transfer structure 518. The first interface 502 is represented as an arbitrary shape and expanse. In an embodiment, the solder preform 514 and the middle heat transfer structure 518 are substantially blended, such that a solder-rich zone 514 overlaps by a decreasing solder concentration gradient into a polymer-solder zone 518. A second interface 504 has been accomplished that blends the middle heat transfer structure 518 with the matrix of the second heat transfer structure 512. In an embodiment, the matrix of the second heat transfer structure 512 and the middle heat transfer structure 518 are substantially blended, such that a solder-polymer zone 518 overlaps into a polymer-rich zone 512. In an embodiment, the respective zones are further blended until a solder-polymer concentration gradient 518 is detectable with a diminishing solder concentration, as it blends into a polymer-rich gradient 512 with an increasing polymer concentration.

Processing to achieve the interfaces 502 and 504 for the heat transfer composite 501 can be done by various operations. In an embodiment, the solder preform 514, the middle heat transfer structure 518, and the matrix of the second heat transfer structure 512 are pressed under a heat load. In an embodiment, these structures are cold stamped.

Figure 6A:
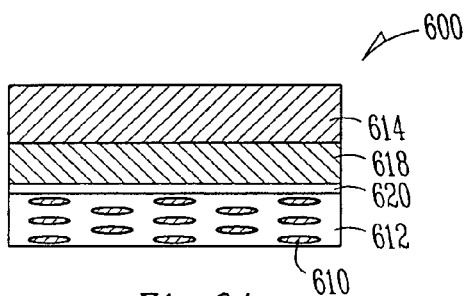
FIG. 6A is a side cross-section of a heat transfer subsystem according to an embodiment.

FIG. 6A is a side cross-section of a heat transfer subsystem 600 according to an embodiment. The heat transfer subsystem 600 is applicable to various chip packaging systems according to embodiments set forth herein and their art-recognized equivalents.

According to the various embodiments set forth in this disclosure, the heat transfer subsystem 600 includes a combination of a plurality of first heat transfer structures 610 and a second heat transfer structure 612 that acts as a matrix for the plurality of first heat transfer structures 610. The second heat transfer structure 612 is added to a solder preform 614 and a middle heat transfer structure 618. The middle heat transfer structure 618 includes a combination of materials that approaches a discrete approximation between the material of the solder preform 614, and the blended materials of the first heat transfer structure 610 and the matrix of the second heat transfer structure 612.

Figure 6B:
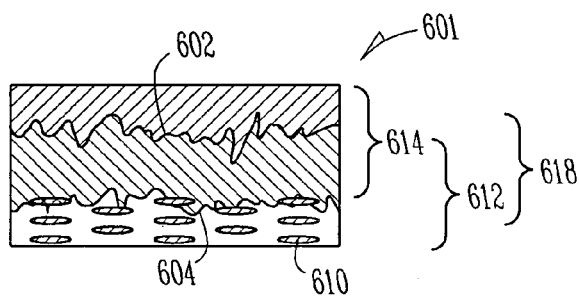
FIG. 6B depicts the heat transfer composite in FIG. 6A after further processing.

In this embodiment, a lower tie layer 620 is disposed between the second heat transfer structure 612 and the middle heat transfer structure 618. The lower tie layer 620 facilitates an intermediate structure that in an embodiment acts as an adhesive for the intermediate structure during processing. In an embodiment, the lower tie layer 620 is an organic adhesive that becomes a fugitive material during heated processing. In an embodiment, the lower tie layer 620 is an organic adhesive that remains in the heat transfer composite 601 (FIG. 6B). In an embodiment, the lower tie layer 620 is a metal such as a solder that facilitates wetting during processing.

FIG. 6B is a depiction of the heat transfer subsystem 600 in FIG. 6A at a heat transfer composite 601 after processing. A first interface 602 has been accomplished that blends the solder preform 614 with the middle heat transfer structure 618. The first interface 602 is represented as an arbitrary shape and expanse. In an embodiment, the solder preform 614 and the middle heat transfer structure 618 are substantially blended, such that a solder-rich zone 614 overlaps by a decreasing solder concentration gradient into a polymer-solder zone 618. A second interface 604 has been accomplished that blends the middle heat transfer structure 618 with the matrix of the second heat transfer structure 612. In an embodiment, the matrix of the second heat transfer structure 612 and the middle heat transfer structure 612 are substantially blended, such that a solder-polymer zone 618 overlaps into a polymer-rich zone 612. In an embodiment, the respective zones are further blended until a solder-polymer concentration gradient 618 is detectable with a diminishing solder concentration, as it blends into a polymer-rich gradient 612 with an increasing polymer concentration.

Processing to achieve the interfaces 602 and 604 for the heat transfer composite 601 can be done by various operations. In an embodiment, the solder preform 614, the middle heat transfer structure 618, and the matrix of the second heat transfer structure 612 are pressed under a heat load. In an embodiment, these structures are cold stamped. The first tie layer 620 is not depicted in FIG. 6B as it is either driven out under a heat load in an embodiment, or it is substantially mixed into the heat transfer composite 601 in another embodiment.

Figure 7A:
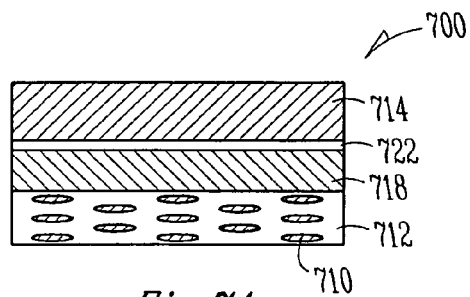
FIG. 7A is a side cross-section of a heat transfer subsystem according to an embodiment.

FIG. 7A is a side cross-section of a heat transfer subsystem 700 according to an embodiment. The heat transfer subsystem 700 is applicable to various chip packaging systems according to embodiments set forth herein and their art-recognized equivalents.

According to the various embodiments set forth in this disclosure, the heat transfer subsystem 700 includes a combination of a plurality of first heat transfer structures 710 and a second heat transfer structure 712 that acts as a matrix for the plurality of first heat transfer structures 710. The second heat transfer structure 712 is added to a solder preform 714 and a middle heat transfer structure 718. The middle heat transfer structure 718 includes a combination of materials that approaches a discrete approximation between the material of the solder preform 714, and the blended materials of the first heat transfer structure 710 and the matrix of the second heat transfer structure 712.

Figure 7B:
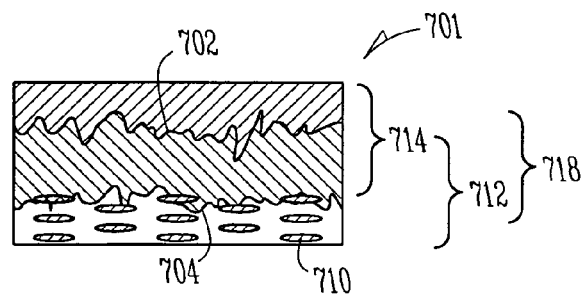
FIG. 7B depicts the heat transfer composite in FIG. 7A after further processing.

In this embodiment, an upper tie layer 722 is disposed between the solder preform 714 and the middle heat transfer structure 718. The upper tie layer 722 facilitates an intermediate structure 700 that in an embodiment acts as an adhesive for the intermediate structure 700 during processing. In an embodiment, the upper tie layer 722 is an organic adhesive that becomes a fugitive material during heated processing. In an embodiment, the upper tie layer 722 is an organic adhesive that remains in the heat transfer composite 701 (FIG. 7B). In an embodiment, the upper tie layer 722 is a metal such as a solder that facilitates wetting during processing.

FIG. 7B is a depiction of the heat transfer subsystem 700 in FIG. 7A as a heat transfer composite 701 after further processing. A first interface 702 has been accomplished that blends the solder preform 714 with the middle heat transfer structure 718. The first interface 702 is represented as an arbitrary shape and expanse. In an embodiment, the solder preform 714 and the middle heat transfer structure 718 are substantially blended, such that a solder-rich zone 714 overlaps by a decreasing solder concentration gradient into a polymer-solder zone 718. A second interface 704 has been accomplished that blends the middle heat transfer structure 718 with the matrix of the second heat transfer structure 712. In an embodiment, the matrix of the second heat transfer structure 712 and the middle heat transfer structure 712 are substantially blended, such that a solder-polymer zone 718 overlaps into a polymer-rich zone 712. In an embodiment, the respective zones are further blended until a solder-polymer concentration gradient 718 is detectable with a diminishing solder concentration, as it blends into a polymer-rich gradient 712 with an increasing polymer concentration.

Processing to achieve the interfaces 702 and 704 for the heat transfer composite 701 can be done by various operations. In an embodiment, the solder preform 714, the middle heat transfer structure 718, and the matrix of the second heat transfer structure 712 are pressed under a heat load. In an embodiment, these structures are cold stamped. The upper tie layer 722 is not depicted in FIG. 7B as it is either driven out under a heat load in an embodiment, or it is substantially mixed into the heat transfer composite 701 in another embodiment.

Figure 8A:
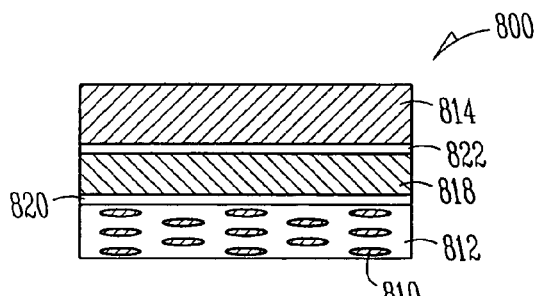
FIG. 8A is a side cross-section of a heat transfer subsystem according to an embodiment.

FIG. 8A is a side cross-section of a heat transfer subsystem 800 according to an embodiment. The heat transfer subsystem 800 is applicable to various chip packaging systems according to embodiments set forth herein and their art-recognized equivalents.

According to the various embodiments set forth in this disclosure, the heat transfer subsystem 800 includes a combination of a plurality of first heat transfer structures 810 and a second heat transfer structure 812 that acts as a matrix for the plurality of first heat transfer structures 810. The second heat transfer structure 812 is added to a solder preform 814 and a middle heat transfer structure 818. The middle heat transfer structure 818 includes a combination of materials that approaches a discrete approximation between the material of the solder preform 814, and the blended materials of the first heat transfer structure 810 and the matrix of the second heat transfer structure 812.

In this embodiment, an upper tie layer 822 is disposed between the solder preform 814 and the middle heat transfer structure 818. Additionally, a lower tie layer 820 is disposed between the second heat transfer structure 812 and the middle heat transfer structure 818. The respective upper and lower tie layers 822 and 820 facilitate an intermediate structure 800 such that in an embodiment, each acts as an adhesive as set forth in this disclosure. In an embodiment, the upper tie layer 822 is an organic adhesive and the lower tie layer 820 is an organic adhesive. In an embodiment, the upper tie layer 822 is an organic adhesive and the lower tie layer 820 is a metallic material. In an embodiment, the upper tie layer 822 is a metallic material and the lower tie layer 820 is an organic adhesive. In an embodiment, the upper tie layer 822 is a metallic material and the lower tie layer 820 is a metallic material.

Figure 8B:
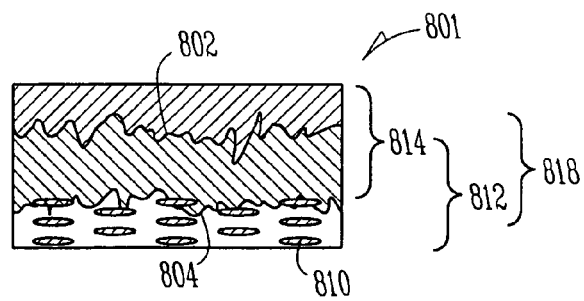
FIG. 8B depicts the heat transfer composite in FIG. 8A after further processing.

FIG. 8B is a depiction of the interface subsytem 800 in FIG. 8A as a heat transfer composite 801 after further processing. A first interface 802 has been accomplished that blends the solder preform 814 with the middle heat transfer structure 818. The first interface 802 is represented as an arbitrary shape and expanse. In an embodiment, the solder preform 814 and the middle heat transfer structure 818 are substantially blended, such that a solder-rich zone 814 overlaps by a decreasing solder concentration gradient into a polymer-solder zone 818. A second interface 804 has been accomplished that blends the middle heat transfer structure 818 with the matrix of the second heat transfer structure 812. In an embodiment, the matrix of the second heat transfer structure 812 and the middle heat transfer structure 812 are substantially blended, such that a solder-lean, polymer-lean zone 814 overlaps into a polymer-rich zone 812. In an embodiment, the respective zones are further blended until a solder-polymer concentration gradient 818 is detectable with a diminishing solder concentration, as it blends into a polymer-rich gradient 812 with an increasing polymer concentration.

Processing to achieve the interfaces 802 and 804 for the heat transfer composite 801 can be done by various operations. In an embodiment, the solder preform 814, the middle heat transfer structure 818, and the matrix of the second heat transfer structure 812 are pressed under a heat load. In an embodiment, these structures are cold stamped. The upper and lower tie layers 822 and 820, respectively, are not depicted in FIG. 8B as they are either driven out under a heat load in an embodiment, or they are substantially mixed into the heat transfer composite 801 in another embodiment.

In an embodiment, any disclosed heat transfer composite is combined with at least one embodiment of the concentration region 440 (FIG. 4). In an embodiment, concentration region 440 includes aligned carbon fibers that create an anisotropic heat channel from the free surface of a second heat transfer structure toward a solder perform, according to the various embodiments.

Figure 9:
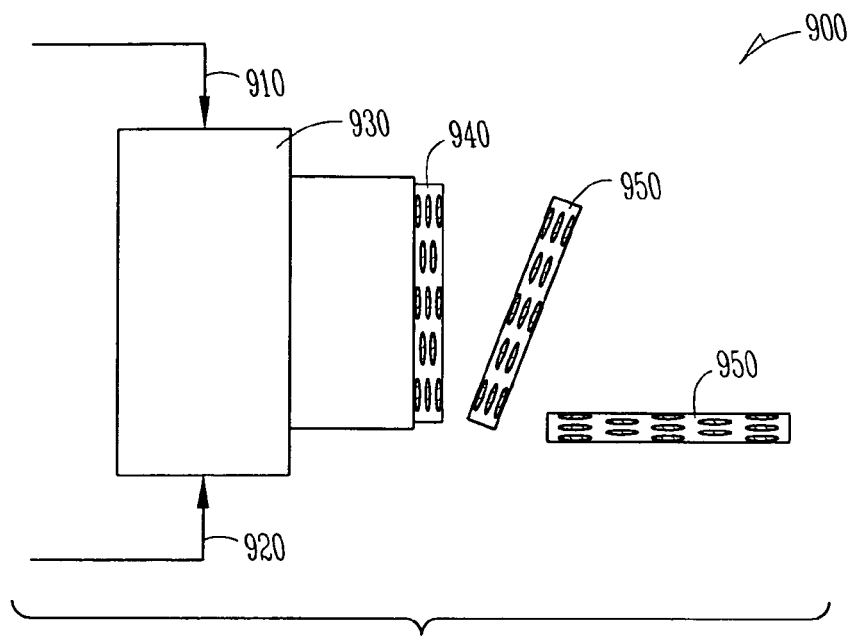
FIG. 9 is a schematic of a process embodiment.

FIG. 9 is a schematic of a process embodiment. In an embodiment, the first heat transfer structure and the matrix of a second heat transfer structure, such as the first heat transfer structure 110 and the second heat transfer structure 112 depicted in FIG. 1A, are processed by co-extrusion and slicing. A particulate feed 910 and a matrix feed 920 are supplied to an extruder 930. The extruder 930 ejects a blended discharge 940 that is sliced into a heat transfer preform 950. Processing includes heat and intermediate curing of the matrix material.

In an embodiment, the blended discharge 940 is made in a mixer. It is mixed, cast into a shape, cured, and sliced.

Figure 10:
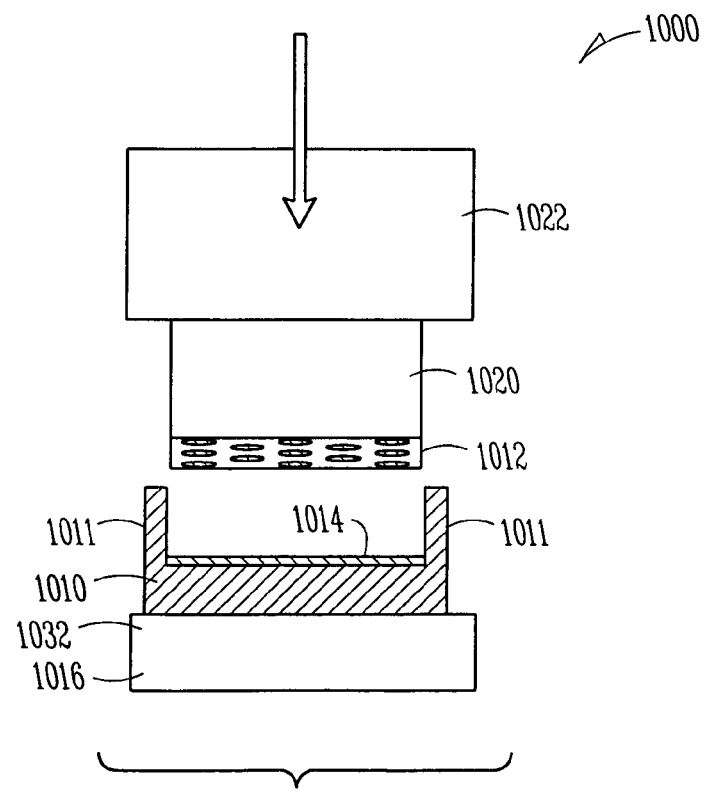
FIG. 10 is a schematic of a method embodiment.

FIG. 10 is a schematic of a method embodiment. FIG. 10 is a side elevation of an assembly that depicts a stamping process and an assembling method 1000 according to an embodiment. In this embodiment, a pre-formed heat spreader substrate 1010 has taken a specific shape prior to the stamping process and an assembling method. In this embodiment, an integrated heat spreader (IHS) 1010 is depicted. A press positive 1020 that is carrying a heat transfer preform 1012 similar to the matrix of the second heat transfer structure 112 (FIG. 1), is stamped against a solder preform 1014. The press positive 1020 is articulated against the solder preform 1014 by the action of a press 1022 as indicated by the heavy downward vertical arrow. Since the IHS 1010 has significant dimensions, the solder preform 1014 is disposed between lip portions 1011 of the IHS 1010, and the press positive 1020 presses against the IHS 1010 without damage to the lip portions 1011.

In an embodiment, the press 1022 includes a support 1032. The support 1032 is used to maintain the IHS 1010 during stamping of the second heat transfer structure 1012 against the solder preform 1014, and onto the IHS 1010. In an embodiment, the support 1032 is a heat source for processes described in this disclosure. Although the method embodiment depicts a solder preform 1014 and a second heat transfer structure 1012 during processing, all of the heat transfer subsystems and/or the heat transfer composites depicted in this disclosure and their art-recognized equivalents are contemplated in this method embodiment.

In a general embodiment, after bringing the IHS 1010 into intermediary contact with the die through the heat transfer subsystem according to various embodiments, bonding the heat transfer subsystem includes reflowing the metal embodiment of the second heat transfer structure 1012, and/or curing an organic embodiment of the second heat transfer structure 1012. Where the bonding heat transfer subsystem includes an organic material, a curing and/or hardening process can be carried out after bringing the structures together. Where the bonding heat transfer subsystem includes an organic/inorganic composite, curing, hardening, and/or reflowing can be carried out after bringing the structures together.

For the embodiments depicted in FIG. 10, processing conditions include a temperature range between ambient and about 160° C. In an embodiment before stamping, the IHS 1010 or generically, a heat spreader substrate is heated above ambient. In an embodiment, stamping is carried out at a temperature for the heat transfer subsystem according to an approximation (TTIM−TAMB)/2. In this temperature approximation, TTIM is the Centigrade melting temperature of the plurality or majority of metals in the heat transfer subsystem. Further, TAMB is the Centigrade ambient temperature and is typically about 25° C.

The stamping pressure can depend upon the heat transfer subsystem material and whether there is a cladding layer. In an embodiment, a pressure of about 200 pounds force per square inch is used. In an embodiment, a pressure of about 400 pounds force per square inch is used. In an embodiment, a pressure in a range from about 200 pounds force per square inch to about 400 pounds force per square inch is used.

EXAMPLE 1

Figure 12:
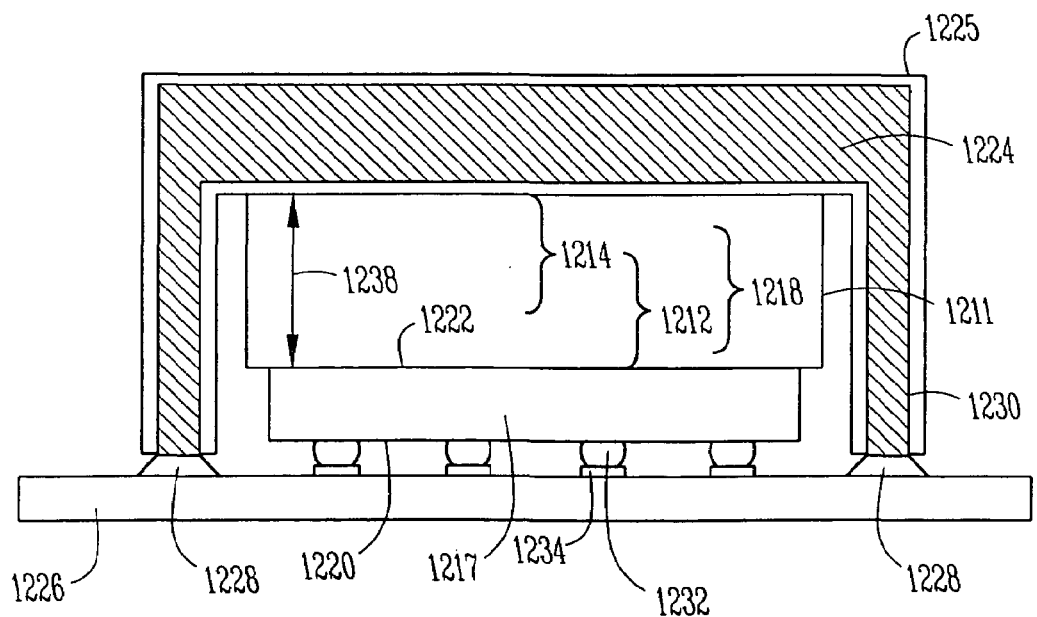
FIG. 12 is a side cross-section of a package according to an embodiment.

Reference is made to FIG. 10, and FIG. 12. In a first example, an IHS-grade copper heat spreader substrate 1224 is clad with a nickel cladding layer 1225. An indium solder preform 1014 is supplied to a press 1022, and the press positive 1020 is articulated in a stamping motion against the solder preform 1014. The solder preform 1014 is preheated by the support 1032 to about 86° C., and the press positive 1020 exerts a force of about 400 pounds force per square inch. In this example, the second heat transfer structure 1012 is also stamped, either simultaneously with the solder preform 1014, or in sequence. After the stamping process, a heat sink assembly is achieved that includes a heat spreader substrate 1224, and a TIM 1238.

EXAMPLE 2

Reference is made to FIG. 5A and FIG. 5B. In a second example, an IHS-grade copper heat spreader substrate is stamped with an indium solder preform 514. The indium solder preform 514 is supplied to a press, and the press positive is articulated in a stamping motion against the solder preform 514. The solder preform 514 is preheated by the support to about 86° C., and the press positive exerts a force of about 400 pounds force per square inch.

After the stamping process, a heat sink assembly is achieved that includes a heat transfer composite 501 that is bonded to an IHS.

Figure 11:
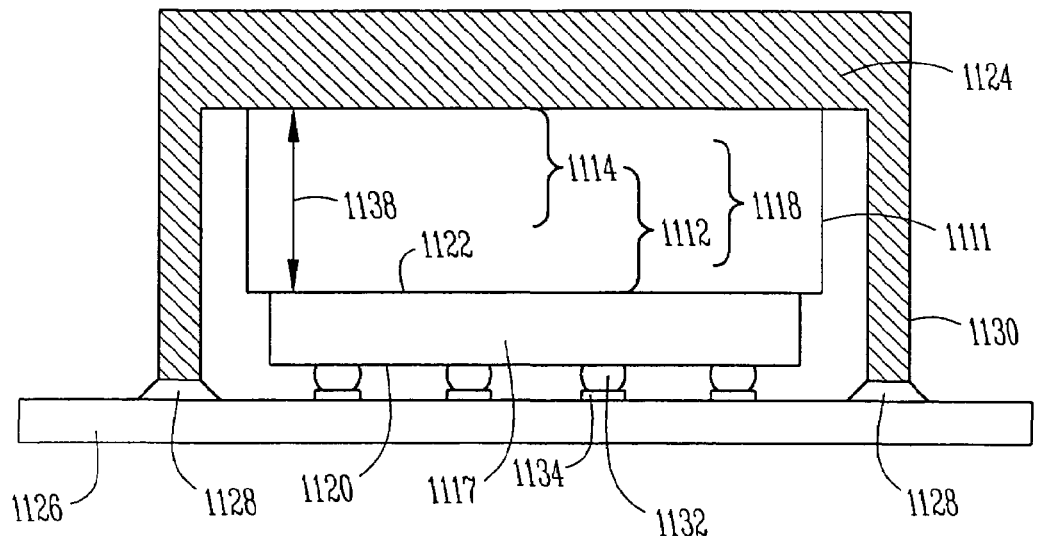
FIG. 11 is a side cross-section of a package according to an embodiment.

FIG. 11 is a side cross-section of a package according to an embodiment. The package includes a heat transfer composite 1111 according to any of the several embodiments set forth in this disclosure. The heat transfer composite 1111 is depicted with an exaggerate thickness. The package includes a die 1117 with an active surface 1120 and a backside surface 1122. The die 1117 is connected to a thermal management device. In an embodiment, the thermal management device is an IHS 1124 that is disposed above the backside surface 1122 of the die 1117. The heat transfer composite 1111, in the form of a TIM, such as any of the disclosed heat transfer composites, in their various embodiments, is disposed between the backside surface 1122 of the die 1117 and the IHS 1124. In another embodiment, the various structures are configured with interfaces as a solder-rich section 1114, a polymer-solder section 1118, and a polymer-rich section 1112. In another embodiment, the heat transfer composite 1111 includes gradients with a solder-rich zone 1114, a polymer-solder zone 1118, and a polymer-rich zone 1112.

The IHS 1124 is attached to a mounting substrate 1126 with a bonding material 1128 that secures a lip portion 1130 of the IHS 1124 thereto. The mounting substrate 1126 is a printed circuit board (PCB), such as a main board, a motherboard, a mezzanine board, an expansion card, or another mounting substrate with a specific application.

In an embodiment, the thermal management device is a heat sink without a lip structure, such as a simple planar heat sink. In an embodiment, the thermal management device includes a heat pipe configuration. The die 1117 is disposed between the heat transfer composite 1111 and a series of electrical bumps 1132 that are in turn each mounted on a series of bond pads 1134. The electrical bumps 1132 make contact with the active surface 1120 of the die 1117. Additionally, the electrical bumps 1132 are depicted in a ball grid array as is known in the art.

By contrast, the heat transfer composite 1111 makes thermal contact with the backside surface 1122 of the die 1117. A bond-line thickness (BLT) 1138 is depicted. The BLT 1138 is the thickness of the heat transfer composite 1111. In an embodiment, the BLT 1138 is in a range from about 100 Å to about 1,000 microns.

Reflow of metallic portions of the heat transfer composite 1111 with the die 1117 can be carried out by thermal processing. Heat can be applied by conventional processes such that if present, the active element materials reach the melting zone of the base solder. For example, where the base solder includes indium, heating is carried out in a range from about 150° C. to about 200° C.

During reflow of metallic portions of the heat transfer composite 1111, the active element(s), if present, dissolve and migrate to the backside surface 1122 of the die 1117. In an embodiment, the solder joint that is formed between the die 1117 and the plurality of first heat transfer materials (e.g. item 112 in FIG. 1B) forms a bond strength in a range from about 1,000 psi to about 2,000 psi.

FIG. 12 is a side cross-section of a package according to an embodiment. The package includes a heat transfer composite 1211 according to an embodiment as set forth herein. The package includes a die 1217 with an active surface 1220 and a backside surface 1222. The die 1217 is connected to a thermal management device. In an embodiment, the thermal management device is an IHS 1224 that is disposed above the backside surface 1222 of the die 1217. Additionally, the IHS 1224 includes a cladding layer 1225. In another embodiment, the various structures are configured with interfaces as a solder-rich section 1214, a polymer-solder section 1218, and a polymer-rich section 1212. In another embodiment, the heat transfer composite 1211 includes gradients with a solder-rich zone 1214, a polymer-solder zone 1218, and a polymer-rich zone 1212.

The heat transfer composite 1211, in the form of a TIM such as any of the heat transfer composites, in their various embodiments, is disposed between the backside surface 1222 of the die 1217 and the IHS 1224. In an embodiment, where the cladding layer 1225 is gold, the solder preform portion of the heat transfer composite 1211 is a solder material.

The IHS 1224 is attached to a mounting substrate 1226 with a bonding material 1228 that secures a lip portion 1230 of the IHS 1224 thereto. The die 1217 is disposed between the heat transfer composite 1211 and a series of electrical bumps 1232 that are in turn each mounted on a series of bond pads 1234. The electrical bumps 1232 make contact with the active surface 1220 of the die 1217. Additionally, the electrical bumps 1232 are depicted in a ball grid array as is known in the art.

By contrast, the heat transfer composite 1211 makes thermal contact with the backside surface 1222 of the die 1217. A BLT 1238 is depicted. In an embodiment, the BLT 1238 is in a range from about 100 Å to about 1,000 microns.

Figure 13:
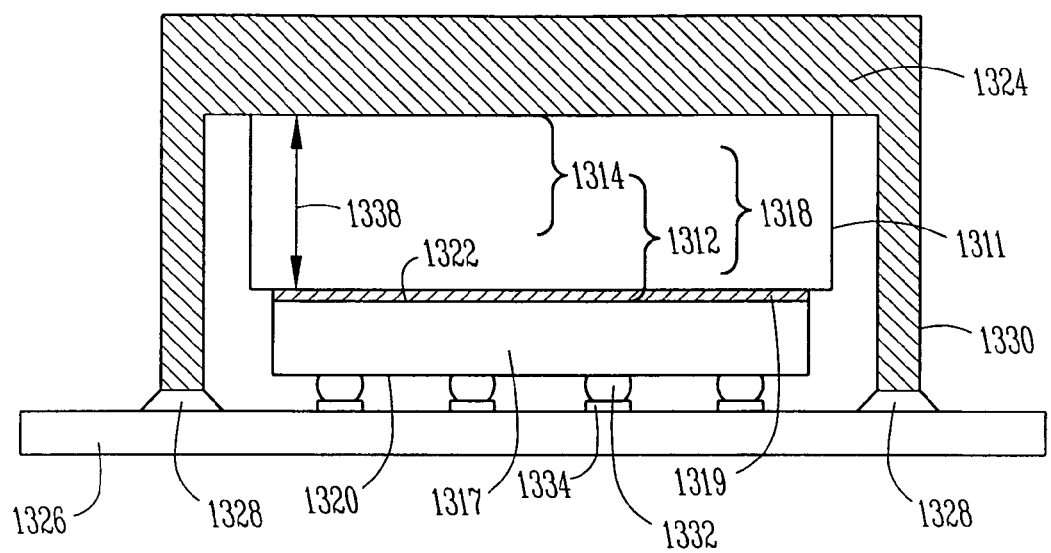
FIG. 13 is a side cross-section of a package according to an embodiment.

FIG. 13 is a side cross-section of a package according to an embodiment. The package includes a heat transfer composite 1311 according to an embodiment as set forth herein. The package includes a die 1317 with an active surface 1320 and a backside surface 1322. The die 1317 is connected to a thermal management device. In an embodiment, the thermal management device is an IHS 1324 that is disposed above the backside surface 1322 of the die 1317. Additionally, the die 1317 includes a cladding layer 1319. In another embodiment, the various structures are configured with interfaces as a solder-rich section 1314, a polymer-solder section 1318, and a polymer-rich section 1312. In another embodiment, the heat transfer composite 1311 includes gradients with a solder-rich zone 1314, a polymer-solder zone 1318, and a polymer-rich zone 1312.

The heat transfer composite 1311, in the form of a TIM, such as any of the disclosed heat transfer composites in their various embodiments, is disposed between the backside surface 1322 of the die 1317 and the IHS 1324. In an embodiment, where the cladding layer 1319 is gold, the matrix portion of the heat transfer composite 1311 is a solder material. In an embodiment, where the cladding layer 1319 is nickel, the matrix portion of the heat transfer composite 1311 is a polymer material.

The IHS 1324 is attached to a mounting substrate 1326 with a bonding material 1328 that secures a lip portion 1330 of the IHS 1324 thereto. The die 1317 is disposed between the heat transfer composite 1311 and a series of electrical bumps 1332 that are in turn each mounted on a series of bond pads 1334. The electrical bumps 1332 make contact with the active surface 1320 of the die 1317. Additionally, the electrical bumps 1332 are depicted in a ball grid array as is known in the art.

By contrast, the heat transfer composite 1311 makes thermal contact with the backside surface 1322 of the die 1317. A BLT 1338 is depicted. In this embodiment, the BLT 1338 is in a range from about 100 Å to about 1,000 microns.

Figure 14:
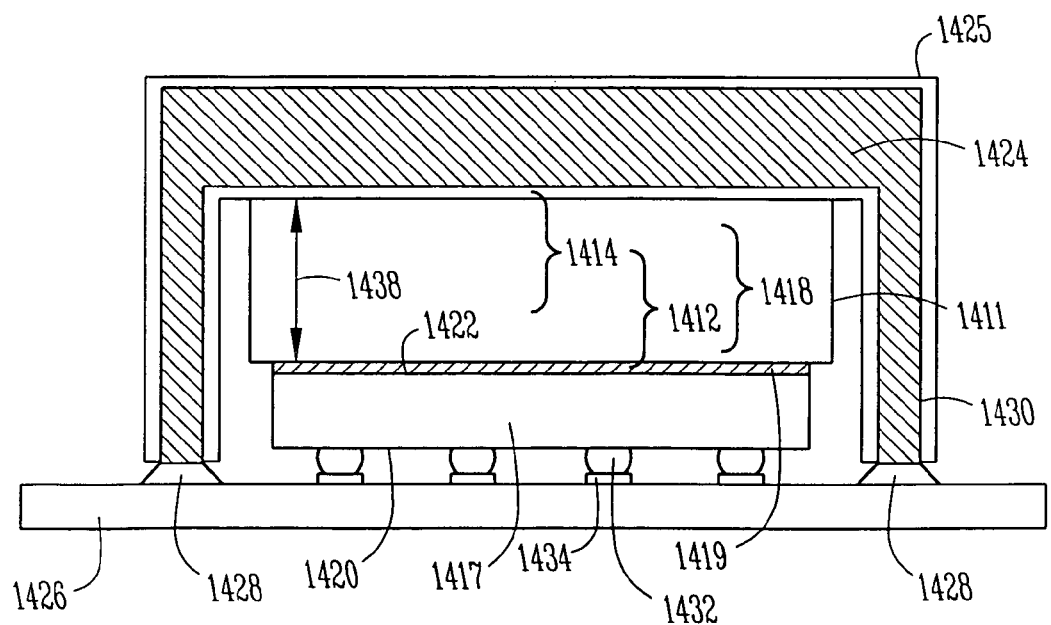
FIG. 14 is a side cross-section of a package according to an embodiment.

FIG. 14 is a side cross-section of a package according to an embodiment. The package includes a heat transfer composite 1411 according to an embodiment as set forth herein. The package includes a die 1417 with an active surface 1420 and a backside surface 1422. The die 1417 is connected to a thermal management device. In an embodiment, the thermal management device is an IHS 1424 that is disposed above the backside surface 1422 of the die 1417. Additionally, the die 1417 includes a cladding layer 1419, and the IHS 1424 includes a cladding layer 1425. In another embodiment, the various structures are configured with interfaces as a solder-rich section 1414, a polymer-solder section 1418, and a polymer-rich section 1412. In another embodiment, the heat transfer composite 1411 includes gradients with a solder-rich zone 1414, a polymer-solder zone 1418, and a polymer-rich zone 1412.

The heat transfer composite 1411, in the form of a TIM such as any of the disclosed heat transfer composites in their various embodiments, is disposed between the backside surface 1422 of the die 1417 and the IHS 1424. In an embodiment, where the cladding layer 1419 is gold, the matrix portion of the heat transfer composite 1411 is a solder material. In an embodiment, where the cladding layer 1419 is nickel, the matrix portion of the heat transfer composite 1411 is a polymer material.

The IHS 1424 is attached to a mounting substrate 1426 with a bonding material 1428 that secures a lip portion 1430 of the IHS 1424 thereto. The die 1417 is disposed between the heat transfer composite 1411 and a series of electrical bumps 1432 that are in turn each mounted on a series of bond pads 1434. The electrical bumps 1432 make contact with the active surface 1420 of the die 1417. Additionally, the electrical bumps 1432 are depicted in a ball grid array as is known in the art.

By contrast, the heat transfer composite 1411 makes thermal contact with the backside surface 1422 of the die 1417. A BLT 1438 is depicted. In this embodiment, the BLT 1438 is in a range from about 100 Å to about 1,000 microns.

Figure 15:
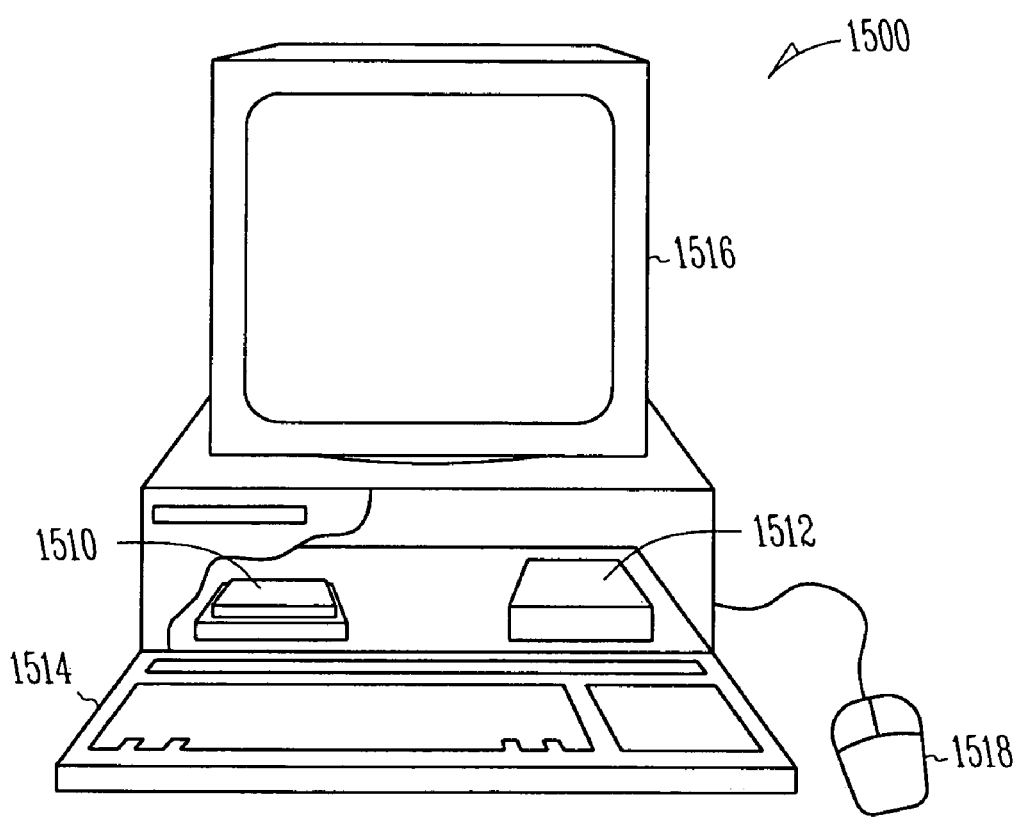
FIG. 15 is a schematic view of a computing system according to an embodiment.

FIG. 15 is a schematic view of a computing system according to an embodiment. The several embodiments set forth in this disclosure are described primarily in the context of utilization with an integrated circuit flip chip configuration, packaged with a mounting substrate and a heat transfer composite that is bonded to an IHS and a die, as shown in the accompanying figures. Other embodiments, however, can be employed that are not limited to just this particular configuration, and the claimed subject matter is applicable to other types of microelectronic packages. For example, microelectronic packages in accordance with the claimed subject matter may include packages with varying form factors, such as, for example, pin grid array, ball grid array, ball grid array with pinned interposers and wire bonding.

One or more of the foregoing embodiments of a microelectronic package may be utilized in a computing system, such as a computing system 1500 of FIG. 15. The computing system 1500 includes at least one processor (not pictured) under a heat transfer composite and IHS 1510, or a heat transfer composite and heat spreader substrate 1510. Additionally, the computing system 1500 includes a data storage system 1512, at least one input device such as keyboard 1514, and at least one output device such as monitor 1516, for example. In an embodiment, the computing system 1500 includes a processor that processes data signals, and may include, for example, a microprocessor, available from Intel Corporation. In addition to the keyboard 1514, the computing system 1500 in an embodiment includes another user input device such as a mouse 1518, for example. In an embodiment, the computing system 1500 utilizes one or more packages such as described in one or more of the foregoing embodiments. For purposes of this disclosure, a computing system 1500 embodying components in accordance with the claimed subject matter may include any system that utilizes a microelectronic package which may include, for example, a data storage device such as dynamic random access memory, polymer memory, flash memory, and phase-change memory. The microelectronic package can also include a die that contains a digital signal processor (DSP), a micro controller, an application specific integrated circuit (ASIC), or a microprocessor. It can now be appreciated that embodiments set forth in this disclosure can be applied to devices and apparatuses other than a traditional computer. For example, a die can be packaged with an embodiment of the heat transfer composite and placed in a portable device such as a wireless communicator or a hand-held device such as a personal data assistant and the like. Another example is a die that can be packaged with an embodiment of the heat transfer composite and placed in a vehicle such as an automobile, a locomotive, a watercraft, an aircraft, or a spacecraft.

Figure 16:
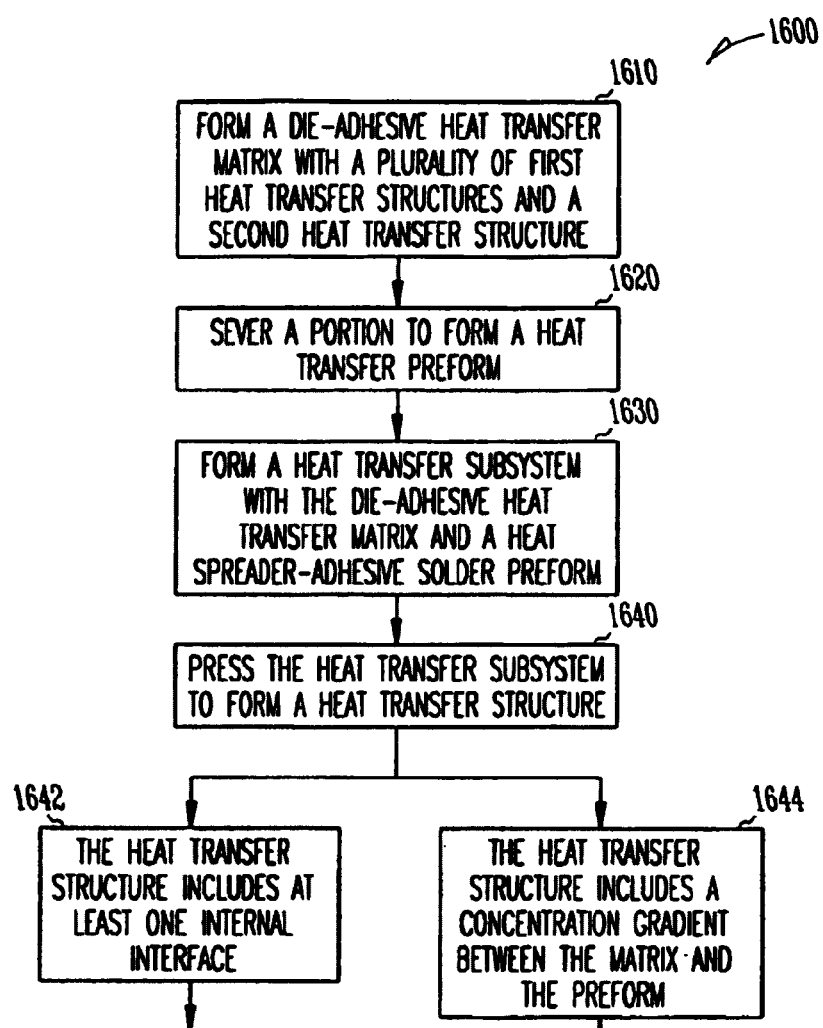
FIG. 16 is a process flow diagram according to an embodiment.

FIG. 16 is a process flow diagram 1600 according to an embodiment. At 1610, the process includes forming a die-adhesive heat transfer matrix with a plurality of first heat transfer structure and a second heat transfer structure. According to a non-limiting example, FIG. 9 depicts the formation of a first heat transfer structure and the matrix of a second heat transfer structure. The structures are co-extruded into the first heat transfer structure 110 and the second heat transfer structure 112 depicted in FIG. 1A.

At 1620, the process continues by severing a portion of the co-extruded material to form a heat transfer composite shape. According to a non-limiting example, FIG. 9 depicts a preform 950 that has been sliced or otherwise separated from the co-extruded material.

At 1630, the process continues with forming a heat transfer subsystem. The die-adhesive heat transfer matrix and the heat spreader-adhesive solder preform are laminated to form the heat transfer subsystem. According to a non-limiting example, FIG. 1A depicts a heat transfer subsystem 100 in a combination with the solder preform 114 laminated to a plurality of first heat transfer structures 110 in the matrix of the second heat transfer structure 112.

At 1640 the process continues by pressing the heat transfer subsystem. According to a non-limiting example, FIG. 10 depicts a pressing process. The pressing process can be heat assisted.

At 1642, the pressing process can be done to achieve a heat transfer structure with at least one interface between precursor materials. According to a non-limiting example, FIG. 1B includes an interface 102 that has been accomplished to blend the matrix of the second heat transfer structure 112 and the solder preform 114.

At 1644, the pressing process can be done to achieve a heat transfer structure with a concentration gradient between the matrix and the preform. According to a non-limiting example, FIG. 11 describes a concentration gradient within the heat transfer composite 1111 that includes a solder preform 1114 that blends into the middle heat transfer structure 1118, that in turn blends into the second heat transfer structure 1112.

Figure 17:
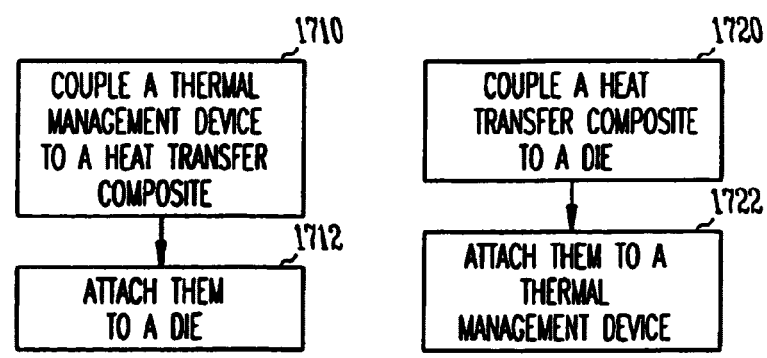
FIG. 17 is a method flow diagram according to an embodiment.

FIG. 17 is a method flow diagram according to an embodiment. The method includes assembling a package that uses a heat transfer composite embodiment.

At 1710 the method includes coupling a thermal management device with a heat transfer composite. According to a non-limiting example, FIG. 10 depicts a pressing process during which a heat transfer composite and an IHS are pressed to form a heat transfer unit.

At 1712, the heat transfer unit is attached to a die to form a package.

An alternative method is depicted also.

At 1720, a heat transfer composite is coupled to a die to form a die unit.

At 1722 the die unit is coupled with an THS to form a package.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
   a plurality of first heat transfer structures disposed in a matrix of a second heat transfer structure;
   a solder preform disposed on the matrix; and
   a transition between the matrix and the solder preform, wherein the transition is selected from an interface and a concentration gradient.

2. The article according to claim 1, wherein the matrix is a polymer, and wherein the plurality of first heat transfer structures is selected from graphite, diamond powder, inorganic dielectric particles, and metal particles.

3. The article according to claim 1, further including:
   a middle heat transfer structure disposed between the matrix and the solder preform, wherein the middle heat transfer structure includes a composition that is transitional between the composition of the matrix and the composition of the solder preform.

4. The article according to claim 1, further including:
   a middle heat transfer structure disposed between the matrix and the solder preform, wherein the middle heat transfer structure includes a composition that is transitional between the composition of the matrix and the composition of the solder preform, wherein the transition between the matrix and the solder preform includes a first interface between the solder preform and the middle heat transfer structure and a second interface between the middle heat transfer structure and the matrix.

5. The article according to claim 1, further including:
   at least one particulate material in the matrix in addition to the plurality of first heat transfer structures.

6. The article according to claim 1, wherein the plurality of first heat transfer structures includes a concentration region in a portion of the matrix.

7. A package comprising:
   a heat spreader;
   a die disposed below the heat spreader; and
   a heat transfer composite disposed above and on the die and below and on the heat spreader, wherein the heat transfer composite includes:
     a plurality of first heat transfer structures disposed in a matrix of a second heat transfer structure, wherein the matrix is a polymer, and wherein the matrix is disposed on the die; and
     a solder preform disposed on the matrix, wherein the solder preform is disposed on the heat spreader.

8. The package according to claim 7, wherein the heat spreader includes a cladding layer selected from nickel, nickel-copper, and gold.

9. The package according to claim 7, wherein the die includes a cladding layer selected from nickel, nickel-copper, and gold.

10. The package according to claim 7, wherein the die includes an active surface and a backside surface, the package further including:
    a mounting substrate, and wherein the die is electrically coupled at the active surface to the mounting substrate.

11. The article of claim 1, wherein the transition is an interface, and wherein the transition includes a solder-rich zone overlapping a polymer-rich zone.

12. The article of claim 1, wherein the transition is a concentration gradient between a solder-rich zone and a polymer-rich zone.

13. The article of claim 3, wherein the transition is an interface, and wherein the transition includes a solder-rich zone overlapping a polymer-rich zone.

14. The article of claim 3, wherein the transition is a concentration gradient between a solder-rich zone and a polymer-rich zone.

15. The article of claim 1, further including a lower tie layer, selected from an organic adhesive and a metal.

16. The article of claim 1, further including an upper tie layer, selected from an organic adhesive and a metal.

17. The article of claim 1, further including at least one of:
    a lower tie layer disposed above and on the matrix, selected from an organic adhesive and a metal; and an upper tie layer disposed below and on the solder preform, selected from an organic adhesive and a metal.

18. The package of claim 7, further including:

a transition between the matrix and the solder preform, wherein the transition is selected from an interface and a concentration gradient.

19. The article of claim 18, wherein the transition is selected from an interface and a concentration gradient, and wherein the transition includes a solder-rich zone overlapping a polymer-rich zone.

20. The package of claim 7, further including:

a middle heat transfer structure disposed between the matrix and the solder preform, wherein the middle heat transfer structure includes a composition that is transitional between the composition of the matrix and the composition of the solder perform; and a transition between the matrix and the solder preform, wherein the transition is selected from an interface and a concentration gradient, and wherein the transition is a gradient between a solder-rich zone and a polymer-rich zone.

21. The package of claim 20 further including at least one of:

a lower tie layer disposed above an on the matrix, wherein the lower tie layer is selected from an organic adhesive and a metal; and an upper tie layer disposed above and on the middle heat transfer structure wherein the upper tie layer is selected from an organic adhesive and a metal.

22. An article comprising:

a plurality of first heat transfer structures disposed in a matrix of a second heat transfer structure;

a solder preform disposed on the matrix; and a transition between the matrix and the solder preform, wherein the transition is selected from an interface and a concentration gradient, wherein the transition is selected from an interface and a gradient, and wherein the transition includes a solder-rich zone overlapping a polymer-rich zone.

23. The article of claim 22, further including:

a middle heat transfer structure disposed between the matrix and the solder preform, wherein the middle heat transfer structure includes a composition that is transitional between the composition of the matrix and the composition of the solder perform; and a transition between the matrix and the solder preform, wherein the transition is selected from an interface and a concentration gradient, and wherein the transition is a gradient between a solder-rich zone and a polymer-rich zone.

24. The article of claim 22, further including at least one of:

a lower tie layer disposed above and on the matrix, selected from an organic adhesive and a metal; and an upper tie layer disposed below and on the solder preform, selected from an organic adhesive and a metal.

* * * * *